United States Patent [19]
Solender

[11] 3,715,687
[45] Feb. 6, 1973

[54] NON-LINEAR VOLTAGE GENERATING APPARATUS

[75] Inventor: Peter E. Solender, Williamsville, N.Y.

[73] Assignee: GTE Sylvania Incorporated

[22] Filed: April 5, 1972

[21] Appl. No.: 241,322

[52] U.S. Cl. ..................331/179, 325/452, 325/453, 334/11

[51] Int. Cl. ..............................................H03j 5/00

[58] Field of Search .334/11; 331/177, 179; 325/452, 325/453

*Primary Examiner*—John Kominski
*Attorney*—Norman J. O'Malley et al.

[57] ABSTRACT

Non-linear voltage generating apparatus for producing curves of tuning voltages for operating voltage controlled oscillators. Binary signals which indicate the desired output frequency of a voltage controlled oscillator to the 10 MHz value are applied to a read only memory. The read only memory produces an incremental digital output signal of value representing the appropriate voltage for the 10 MHz value and also a companion differential digital output signal of value representing the differential between the voltage for the 10 MHz value and for the next higher 10 MHz value. Both digital output signals are applied to respective linear digital-to-analog converters. The differential analog output signal from the linear digital-to-analog converter and binary signals which indicate the units of MHz of the desired output frequency of the voltage controlled oscillator are applied to interpolating circuitry. The interpolating circuitry produces an interpolated analog output signal of the proper proportion of the differential analog output signal. The incremental analog output signal and the interpolated analog output signal are added in a summing network to produce the proper tuning voltage causing the voltage-controlled oscillator to operate at the desired frequency.

5 Claims, 2 Drawing Figures

NON-LINEAR VOLTAGE GENERATING APPARATUS

BACKGROUND OF THE INVENTION

This invention relates to apparatus for producing output voltages which are non-linear with respect to applied input signals. More particularly, it is concerned with apparatus for generating curves of tuning voltages for operating voltage controlled oscillators.

The use of voltage controlled oscillators to generate frequencies for operating communication receivers is well known. Voltage controlled oscillators require a variable tuning voltage and product output frequencies which are non-linear with respect to the applied tuning voltages. Thus, the output of the tuning voltage generator must be non-linear with respect to its input, since its input is designated in terms of frequency.

In systems in which tuning is done directly or manually, as by setting panel switches which are labeled to designate frequency, the variable tuning voltage can be obtained directly by using a resistor network controlled by the switches. However, in receivers which are either remote controlled or controlled from sources such as preset electronic memories, generation of the variable tuning voltage must be done electronically. In some receiver systems covering relatively narrow bands of frequencies the tuning voltages can be derived from the synthesizer. However, with receivers covering a wide band of frequencies requiring two or more voltage-controlled oscillators, it is difficult to obtain tuning voltages from the synthesizer.

One technique which has been employed for generating tuning voltages utilizes a read only memory in which all the necessary tuning voltages are stored in digital format. The location of each piece of digital data is identified with a corresponding output frequency. The appropriate digital data is read out of the memory by addressing the location of the memory associated with the desired frequency. The digital value of voltage is applied to a digital-to-analog converter to produce an analog tuning voltage which is then applied to the voltage controlled oscillator. However, since it is generally necessary to discriminate between frequencies in relatively small steps, for example, of the order of 1 megahertz, this technique requires a memory of fairly large capacity to store data on all the voltage points to cover a broad band of frequencies.

SUMMARY OF THE INVENTION

Improved apparatus in accordance with the present invention for generating any of a plurality of output voltages which are non-linear with respect to the input signals includes a first input means for producing any selected one of a predetermined sequence of first input signals. Each first input signal indicates a discrete value, and the discrete values indicated by the sequence of first input signals form a sequence of discrete values. (For example, the input signals may indicate discrete values of a range of frequencies, each separated by 10 MHz.). The apparatus also includes a second input means for producing any selected one of a predetermined number of second input signals, each indicating a value less than the differential between the discrete value indicated by the selected one of the first input signals and an adjacent discrete value of the sequence. (The second input signals may indicate unit values of frequency in megahertz; i.e., 1 through 10 MHz. The differential is 10 MHz.) The ratio of the value indicated by the selected second input signal to the differential between the discrete values as determined by the selected first input signal is designated a proportional value.

The apparatus includes a memory means which is coupled to the first input means and produces any one of an equal sequence of first digital output signals. Each first digital output signal has a digital value representing a non-linear output signal corresponding to the discrete value of one of the first input signals. The digital values representing the non-linear output signals form a sequence of digital values which are non-linear with respect to the sequence of corresponding discrete values indicated by the first input signals. (That is, there is a stored digital value of voltage corresponding to each 10 MHz increment of the frequency range as indicated by discrete values of the first input signals.) The memory means operates to produce the particular one of the sequence of first digital output signals corresponding to the selected one of the first input signals applied thereto.

The memory means also operates to produce a companion second digital output signal which has a digital value representing the differential between the digital value of the particular one of the first digital output signals corresponding to the selected one of the first input signals and the digital value of the first digital output signal corresponding to the adjacent first input signal of the sequence. (The second output signal may be a digital value of voltage equal to the difference in voltage between the first digital value of voltage being produced by the memory means and the first digital value of voltage corresponding to a first input signal for the next higher 10 MHz increment.)

A first converting means is coupled to the memory means for converting the first digital output signal from the memory means to a first analog output signal of value equal to the value of the first digital output signal. A second converting means is also coupled to the memory means for converting the second digital output signal from the memory means to a second analog output signal of value equal to the value of the second digital output signal.

An interpolating means is coupled to the second input means and to the second converting means and operates to produce an interpolated second analog output signal of value equal to the product of the proportional value and the value of the second analog output signal. (That is, an interpolated second analog voltage is produced which is equal to the unit value of frequency, in megahertz, indicated by the second input signal, divided by 10 MHz, and multiplied by the value of the differential voltage from the memory means.) A combining means is coupled to the first converting means and to the interpolating means and combines the first analog output signal and the interpolated second analog output signal whereby an analog output signal of predetermined value as determined by the selected first and second input signals is produced. (That is, by adding the first analog voltage, which is determined by the 10 MHz increment of frequency, to the interpolated second analog voltage, which is determined by the megahertz units of frequency and the differential between the voltage of the 10 MHz increment and the next higher 10 MHz increment, a predetermined analog output voltage is obtained.)

BRIEF DESCRIPTION OF THE DRAWING

Additional objects, features, and advantages of non-linear voltage generating apparatus in accordance with the present invention will be apparent from the following detailed discussion together with the accompanying drawings wherein.

DETAILED DESCRIPTION OF THE INVENTION

Figure 1:
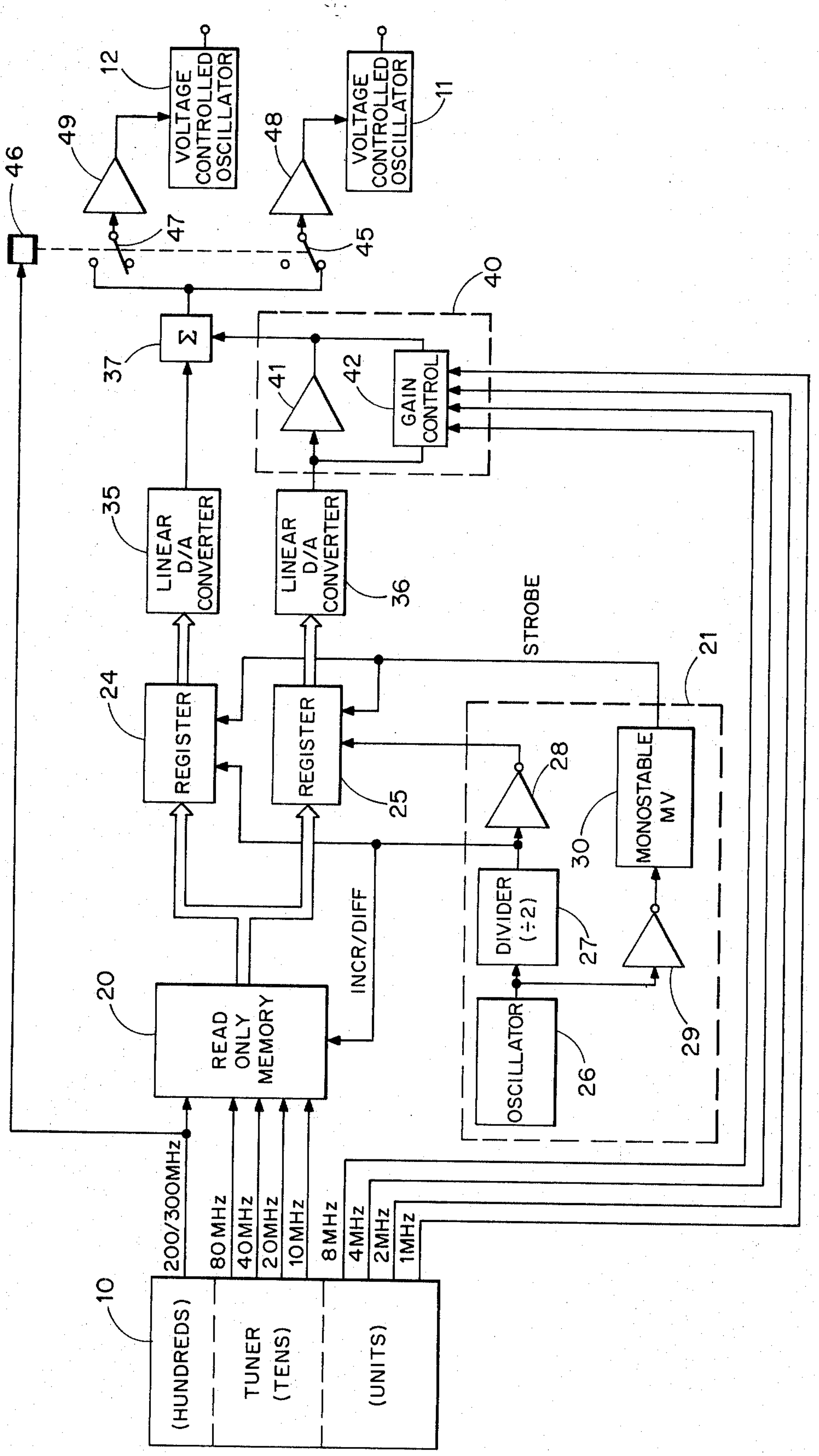
FIG. 1 is a block diagram of apparatus in accordance with the invention employed with voltage controlled oscillators for producing a band of output frequencies.

The specific embodiment of the apparatus in accordance with the invention as illustrated in FIG. 1 is employed to generate two separate ranges of output frequencies. Specifically, by appropriate digital binary input signals from a tuner 10 a selected one of a first range of frequencies from 220 to 299 megahertz is produced by a first voltage controlled oscillator 11 or a frequency selected from a second range of from 300 to 399 megahertz is produced by a second voltage-controlled oscillator 12. The separation between adjacent frequencies in each of the ranges is 1 megahertz. The curve of voltage to be generated for tuning the first voltage controlled oscillator 11 is illustrated as curve 13 in FIG. 2 and the curve of voltages to be generated for tuning the second voltage controlled oscillator 12 is illustrated as curve 14 in FIG. 2.

The signals from the tuner 10 are binary coded decimal signals which indicate the units and tens values of the desired output frequency in megahertz. Another binary signal is employed on the line designated 200/300 MHz to identify the frequency as being either in the low range starting at 200 megahertz or in the high range starting at 300 megahertz. The signals are linear with respect to the output frequencies from the voltage controlled oscillators. However, because of the non-linear characteristics of voltage controlled oscillators as illustrated by the voltage-frequency curves of FIG. 2, input signals from the tuner 10 are employed to generate voltage points for each 1 megahertz step of output frequency in order to approximate the curves 13 and 14 of FIG. 2. The voltage points as constructed by the apparatus are applied to the appropriate voltage controlled oscillator 11 or 12 to produce the output frequency as selected by the input signals from the tuner 10.

As illustrated in FIG. 1 the tuner 10 may be considered as divided into three sections for producing signals designating the desired frequency in terms of units, tens, and hundreds of megahertz. The signals indicating units and tens of megahertz are in binary coded decimal format. In this embodiment only a single hundreds input signal is employed, its absence or presence indicating the lower or higher range of frequencies, respectively. The tens of megahertz data is applied to a read only memory 20 over four appropriately labeled input lines as shown in FIG. 1, and the hundreds data is supplied to the read only memory 20 on the line labeled 200/300 MHz. In addition, there is an input to the read only memory 20 on line INCR/DIFF from a multiplexing arrangement 21 as will be explained hereinbelow.

In the specific embodiment illustrated in FIG. 1, the read only memory 20 is a 64×9 memory capable of producing any of 64 possible 9-bit output signals as determined by the input signals. The read only memory 20 is constructed so as to provide 9-bit digital outputs which have values representing the appropriate voltage points corresponding to 10 MHz increments of frequency as designated by the input signals. The appropriate digital value of voltage corresponding to the input signals applied to the memory from the tuner 10 occurs while an INCR control signal is applied to the memory by the multiplexing arrangement 21.

Figure 2:
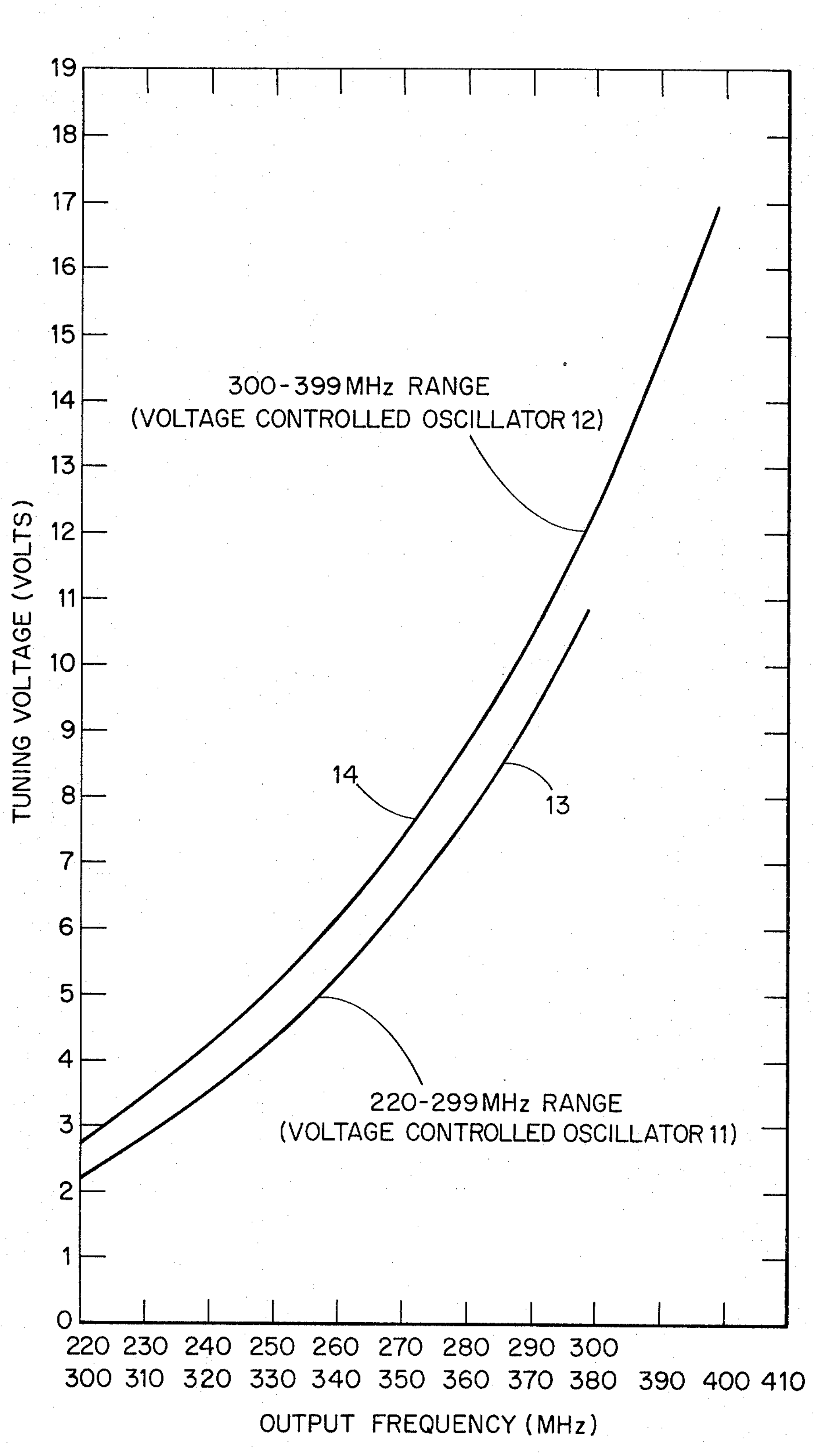
FIG. 2 illustrates non-linear curves of tuning voltage with respect to output frequency for operating voltage controlled oscillators as employed in the specific embodiment of the system of FIG. 1.

The voltages represented by the possible digital outputs are the points on the curves 13 and 14 of FIG. 2 associated with the corresponding 10 MHz increments of frequency. Thus, the output signals from the memory 20 are non-linear with respect to the input signals in order to produce the proper voltage points.

As an example, it is assumed that the system is to produce an output frequency of 263 megahertz from the voltage controlled oscillator 11. The tuner 10 is set to provide "1's" on the 40 MHz and 20 MHz lines and "0's" as the 200/300 MHz, 80 MHz, and 10 MHz lines to the memory 20. A "1" indicating an INCR signal is also present on the INCR/DIFF line from the multiplexing arrangement 21. The incremental output signal from the read only memory 20 is a digital signal indicating an output of, for example, 5.3 volts, the voltage point on curve 13 for the 260 megahertz increment of frequency.

In addition, the read only memory 20 provides companion 9-bit digital outputs which have values representing the voltage differences between each voltage point corresponding to each 10 MHz increment of frequency and the next higher voltage point at the next higher 10 MHz increment of frequency. The appropriate digital value of differential voltage corresponding to the input signals applied to the memory from the tuner 10 occurs while a DIFF control signal is applied to the memory by the multiplexing arrangement 21. Again assuming that the tuner 10 is set to provide "1's" on the 40 MHz and 20 MHz lines, a "0" indicating a DIFF signal on the INCR/DIFF line causes the memory 20 to produce a digital signal indicating an output of, for example, 1.2 volts; the difference between the 5.3 volts for the 260 megahertz increment and 6.5 volts for the 270 megahertz increment.

The multiplexing arrangement 21 operates to produce "1's" and "0's" in alternation indicating INCR and DIFF signals, respectively, on the INCR/DIFF line to the memory 20. The multiplexing arrangement also causes the digital signal representing the voltage for the 10 MHz incremental signal to be loaded in a first register 24 and the companion digital signal representing the voltage differential signal to be loaded in a second register 25. The contents of the registers 24 and 25 are transferred out by a strobe signal, also from the multiplexing arrangement 21.

As shown in FIG. 1 the multiplexing arrangement 21 includes an oscillator 26 the output of which is passed through a divide-by-two divider 27. The output from the divider is applied to the memory 20 over the INCR/DIFF line. The output from the divider 27 is also applied directly to the first register 24 and through an inverter 28 to the second register 25. Thus, when the INCR control signal is present on the INCR/DIFF line, the incremental output signal from the memory 20 is loaded into the first register 24. When the DIFF control signal is present on the INCR/DIFF line the differential output signal from the memory 20 is loaded into the second register 25. The output of the oscillator 26 also passes through an inverter 29 to a monostable multivibrator 30. The monostable multivibrator produces a short strobe pulse to the registers 24 and 25 on the trailing edge of each pulse from the oscillator 25 thereby causing the registers 24 and 25 to be read out.

The incremental and digital output signals from the registers 34 and 35 are applied to the linear digital-to-analog converters 35 and 36, respectively. Each linear digital-to-analog converter produces an analog output voltage which is linear with respect to the value of the applied input signal. The output from the first linear digital-to-analog converter 35 is an analog voltage representing the voltage point of the 260 megahertz increment (5.3 volts) of curve 13. This incremental analog voltage is applied directly to a summing network 37. The output of the second linear digital-to-analog converter 36 is an analog voltage representing the voltage differential between the voltage points of the 260 and 270 megahertz increments (1.2 volts). This differential analog voltage is applied to a linear interpolating circuit 40.

The linear interpolating circuit 40 includes an operational amplifier 41 the gain of which is controlled by feedback through a gain control 42. Signals indicating the selected units of frequency in megahertz are applied to the gain control 42 over the appropriate lines from the tuner 10. The gain control 42 may include an arrangement of resistors which are selectively gated in and out of the feedback path by the applied input signals to provide gain which is linear with the value indicated by the input signals. For the present example, "1's" are present on the 2 MHz and 1 MHz lines and "0's" are present on the 8 MHz and 4 MHz lines indicating a value of 3. The linear interpolating circuit, therefore, operates to multiply the differential analog voltage representing 1.2 volts from the linear digital-to-analog converter 36 by three-tenths. The output value of the linear interpolating circuit 40 which is applied to the summing network 37 thus represents 0.36 volts.

The incremental analog voltage from the linear digital-to-analog converter 35 and the interpolated analog voltage from the linear interpolating circuit 40 are combined by the summing network 37 to produce an analog output voltage representing 5.66 volts. This voltage is applied through contacts 45 of relay 46, which are in their normal position, to a first operational amplifier 48. The operational amplifier is adjusted to provide the proper amount of linear gain and voltage offset. The output of the operational amplifier 48 is applied to the first voltage controlled oscillator 11. In the present example, the resulting voltage applied to the first voltage controlled oscillator 11 is 5.66 volts. Thus, the proper voltage point on the turning curve is obtained causing the voltage controlled oscillator 11 to produce the desired 263 megahertz output signal.

In the specific embodiment of the invention as described two separate voltage controlled oscillators, having different voltage-frequency characteristics, are employed to generate the two ranges of frequencies. The range of frequencies from 300 to 399 megahertz is produced by the second voltage controlled oscillator 12 which has a tuning curve as shown by curve 14 of FIG. 2. When appropriate input signals are present on the hundreds and tens input lines, for example, "1's" on the 200/300, 40, and 20 MHz lines to indicate an increment of 360 megahertz, appropriate predetermined digital representations of the voltages for the 360 megahertz increment and for the differential between the 360 and 370 megahertz voltages are read out under control of the multiplexer 21. The incremental and companion differential signals are placed in the proper registers 24 and 25 and applied to the linear digital-to-analog converters 35 and 36. The output of the incremental signal linear digital-to-analog converter 35 is applied directly to the summing network 37. The output of the differential signal linear digital-to-analog converter 36 is reduced to the proper proportional value by the interpolating arrangement 40 as determined by the units of megahertz signal from the tuner 10 in the same manner as explained previously.

The presence of the signal on the 200/300 megahertz line actuates relay 46 causing relay contacts 45 to be opened and relay contacts 47 to be closed thus disconnecting the first voltage controlled oscillator 11 from the summing network 37 and connecting the second voltage controlled oscillator 12 to the summing network 37. Thus, the appropriate analog voltage is produced by the summing network 37 and applied to the second voltage controlled oscillator 12 through the operational amplifier 49.

Although a specific embodiment in accordance with the present invention has been shown and described in detail, various modifications are obviously possible. For example, by increasing the capacity of the read only memory 20 and by adding an additional hundreds input four separate tuning curves each covering a range of approximately 100 megahertz may be generated. Individual timing curves covering ranges greater than or less than 100 megahertz may be generated depending upon the voltage-frequency characteristics of the voltage controlled oscillators or other apparatus for which the curves may be generated. In addition, several voltage controlled oscillators may be employed with pulse stretchers at the inputs of the operational amplifiers and with suitable multiplexing arrangements in order to produce several variable independent output frequencies simultaneously.

The apparatus in accordance with the invention provides predetermined voltage values for spaced increments of the non-linear voltage curve and interpolates between the incremental values for precise values. Thus, the apparatus employs a read only memory with a much smaller capacity than would be necessary in order to cover every voltage point on the desired curve directly. In the specific embodiment disclosed, to cover the band of frequencies from 220 to 399 megahertz, a 64×9 memory is required in order to produce one of 64 possible 9-bit output signals. To cover every voltage point over the same band directly would require a 512×9 memory in order to produce one of 512 possible 9-bit output signals.

In addition, as explained, the apparatus readily may be expanded to employ three, four, or more voltage controlled oscillators as desired. Very little additional equipment is needed for generating additional curves, other than a slightly expanded read only memory. The apparatus permits remote controlled tuning since the input signals to the read only memory 20 and to the linear interpolating circuit 40 are digital bits which may be generated and transmitted readily by any of a great variety of means.

Therefore, while there has been shown and described what is considered a preferred embodiment of the present invention, it will be obvious to those skilled in the art that various changes and modifications may be made therein without departing from the invention as defined in the appended claims.

What is claimed is:

1. Apparatus for producing one of a plurality of output signal conditions having a non-linear relationship to a selected one of a plurality of corresponding input signal conditions including in combination first input means for producing any selected one of a predetermined sequence of first input signals, each first input signal indicating a discrete value, and the discrete values indicated by said sequence of first input signals forming a sequence of discrete values;

second input means for producing any selected one of a predetermined number of second input signals, each indicating a value less than the differential between the discrete value indicated by the selected one of said first input signals and an adjacent discrete value of said sequence, the ratio of the value indicated by the selected second input signal to the differential between the discrete values as determined by the selected first input signal being designated a proportional value;

memory means coupled to said first input means for producing any one of a sequence of first digital output signals, the number of first digital output signals in the sequence being equal to the number of first input signals in the sequence of first input signals and each first digital output signal having a digital value representing a non-linear output signal corresponding to the discrete value of one of said first input signals, the digital values representing the non-linear output signals forming a sequence of digital values which are non-linear with respect to the sequence of corresponding discrete values indicated by the first input signals; said memory means being operable to produce the particular one of said sequence of first digital output signals corresponding to the selected one of the first input signals applied thereto, and said memory means being operable to produce a companion second digital output signal having a digital value representing the differential between the digital value of said particular one of the first digital output signals corresponding to the selected one of said first input signals and the digital value of the first digital output signal corresponding to the adjacent first input signal of said sequence;

first converting means coupled to the memory means for converting the first digital output signal from said memory means to a first analog output signal of value equal to the value of the first digital output signal;

second converting means coupled to the memory means for converting the second digital output signal from said memory means to a second analog output signal of value equal to the value of the second digital output signal;

interpolating means coupled to said second input means and to said second converting means and operable to produce an interpolated second analog output signal of value equal to the product of said proportional value and the value of the second analog output signal; and combining means coupled to said first converting means and to said interpolating means for combining the first analog output signal and the interpolated second analog output signal whereby an analog output signal of predetermined value as determined by the selected first and second input signals is produced.

2. Apparatus in accordance with claim 1 wherein said first input means is operable to produce first input signals which are digital and have discrete values which differ from adjacent discrete values in said sequence by equal differential values;

said second input means is operable to produce second input signals which are digital and have values which differ from adjacent values by equal values, the values of said second input signals covering the range from zero value to the differential value between adjacent discrete values of said first input signals;

said first converting means includes first linear digital-to-analog converting means operable to produce a first output voltage having a value which is linear with respect to the value of the first digital output signal from the memory means;

said second converting means includes second linear digital-to-analog converting means operable to produce a second output voltage having a value which is linear with respect to the value of the second digital output signal from the memory means;

said interpolating means is operable to produce an interpolated second output voltage having a value equal to the product of said proportional value and the value of the second output voltage; and said combining means is operable to combine the first output voltage and the interpolated second output voltage thereby to produce an output voltage of predetermined value as determined by the selected first and second input signals.

3. Apparatus in accordance with claim 2 wherein said memory means includes read-only memory means having a group of input terminals coupled to the first input means for receiving said first input signals in binary format, and having an additional input terminal; said read-only memory means being operable when a first control signal is applied to said additional input terminal to produce a first digital output signal representing a predetermined value having a non-linear relationship to the value of the first input signal applied thereto, and being operable when a second control signal is applied to said additional input terminal to produce a companion second digital output signal representing a predetermined value equal to the difference between the value of the first digital output signal corresponding to the first input signal being applied to the read-only memory means and the value of the first digital output signal corresponding to an adjacent first input signal of the sequence of first input signals;

a first register means coupled to the read-only memory means and operable to receive and store digital output signals from the read-only memory means in response to a first control signal being applied thereto;

a second register means coupled to the read-only memory means and operable to receive and store digital output signals from the read-only memory means in response to a second control signal being applied thereto; and multiplexing means coupled to said additional input terminal of the read-only memory means and to the first and second register means and operable to alternately apply first control signals to the read-only memory means and the first register means and second control signals to the read-only memory means and the second register means whereby a cycle of first and second control signals causes a first digital output signal to be stored in the first register means and a companion second digital output signal to be stored in the second register means, said multiplexing means being operable to cause the first digital output signal stored in the first register means and the companion second digital output signal stored in the second register means to be applied to the first and second converting means, respectively.

4. Apparatus in accordance with claim 3 wherein said read-only memory means produces a second digital output signal having a value equal to the difference between the value of the first digital output signal corresponding to the first input signal being applied to the read-only memory means and the value of the first digital output signal corresponding to the adjacent first input signal of next higher order in sequence; and said combining means is operable to add the first output voltage and the interpolated second output voltage to produce an output voltage having a predetermined non-linear relationship to the sum of the values indicated by the first and second input signals.

5. Apparatus for producing an output signal of predetermined frequency including in combination apparatus in accordance with claim 4 and further including first voltage controlled oscillator means operable to produce an output signal having a frequency determined by the voltage applied thereto, the relationship between the applied voltage and the frequency of the output signal being non-linear, said first voltage controlled oscillator means being operable to produce output signals over a first range of frequencies;

second voltage controlled oscillator means operable to produce an output signal having a frequency determined by the voltage applied thereto, the relationship between the applied voltage and the frequency of the output signal being non-linear, said second voltage controlled oscillator means being operable to produce output signals over a second range of frequencies;

switching means coupled to the combining means and to the first and second voltage controlled oscillator means and operable when a first control condition is applied thereto to cause the output voltage from the combining means to be applied to the first voltage controlled oscillator means and operable when a second control condition is applied thereto to cause the output voltage from the combining means to be applied to the second voltage controlled oscillator means; and wherein said read-only memory means has a further input terminal and is operable in response to said first control condition being applied to the further input terminal to produce any one of a first plurality of first digital output signals and a companion second digital output signal as determined by the first input signal applied at said group of input terminals; the relationship between the values of the first and second input signals and the values of the first and companion second digital output signals from the read-only memory means corresponding to the first input signals being such that the resulting output voltage from the combining means when applied to the first voltage controlled oscillator means causes the first voltage controlled oscillator means to produce an output signal the frequency of which is linear with respect to the sum of the values of the first and second input signals; and said read-only memory means is operable in response to said second control condition being applied to the further input terminal to produce any one of a second plurality of first digital output signals and a companion second digital output signal as determined by the first input signal applied at said group of input terminals; the relationship between the values of the first and second input signals and the values of the first and companion second digital output signals from the read-only memory means corresponding to the first input signals being such that the resulting output voltage from the combining means when applied to the second voltage controlled oscillator means causes the second voltage controlled oscillator means to produce an output signal the frequency of which is linear with respect to the sum of the values of the first and second input signals.

* * * * *